US005750914A

United States Patent [19]

Takahashi

[11] Patent Number: 5,750,914

[45] Date of Patent: May 12, 1998

[54] ELECTRONIC MUSICAL INSTRUMENT HAVING AN EFFECT DATA CONVERTING FUNCTION

[75] Inventor: Makoto Takahashi, Hamamatsu, Japan

[73] Assignee: Yamaha Corporation, Japan

[21] Appl. No.: 471,423

[22] Filed: Jun. 6, 1995

[30] Foreign Application Priority Data

| | | | |
|---|---|---|---|
| Jul. 18, 1994 | [JP] | Japan | 6-186828 |
| Nov. 18, 1994 | [JP] | Japan | 6-308361 |

[51] Int. Cl.[6] .................... G10H 1/02; G10H 1/06; H03G 3/00

[52] U.S. Cl. .................... 84/626; 84/622; 84/659; 84/662; 381/61; 381/118

[58] Field of Search .................... 84/622–633, 659–665; 381/61–65, 118

[56] References Cited

U.S. PATENT DOCUMENTS

| | | | |
|---|---|---|---|
| 4,628,789 | 12/1986 | Fujimori | 84/626 |
| 4,777,857 | 10/1988 | Stewart . | |
| 5,081,898 | 1/1992 | Fujimori | 84/622 |
| 5,410,603 | 4/1995 | Ishiguro et al. | 381/61 |

FOREIGN PATENT DOCUMENTS

| | | |
|---|---|---|
| 0484043 A3 | 5/1992 | European Pat. Off. . |
| 0597381 A3 | 5/1994 | European Pat. Off. . |
| 4-7519 | 2/1992 | Japan . |

*Primary Examiner*—Stanley J. Witkowski
*Attorney, Agent, or Firm*—Graham & James LLP

[57] ABSTRACT

Effect data designating a desired sound effect is introduced from the outside, and a tone generator generates a tone imparted with an effect based on the introduced effect data. A conversion table is provided which classifies predetermined effects impartable by the tone generator into groups in accordance with characteristics of the effects and stores for each of the groups effect data indicative of effect belonging to the group. If it is ascertained, from the table, that the introduced effect data designates an effect not impartable by the tone generator, the effect data indicative of another effect belonging to one of the groups which corresponds to a characteristic of the introduced effect data is extracted from the table. The tone generator imparts the tone the effect designated by the extracted effect data in place of the introduced effect data. The tone color data may also be introduced from the outside, and if the tone color data designates a tone color not generatable by the tone generator, the tone color data may be converted to another designating another tone color generatable by the tone generator. At that time, it is determined whether a combination of converted sound effect and tone color falls under a predetermined inhibition condition and, if so, at least one of the effect and tone color data is converted again so that the combination does not fall under the inhibition condition any longer.

24 Claims, 7 Drawing Sheets

| TONE COLOR NAME | EFFECT NAME |
|---|---|
| Piano 1 ∫ Piano 5 | Distortion |
| | Flanger |
| | · |
| | · |

| TONE COLOR NAME | EFFECT NAME |
|---|---|
| Violin | Echo |
| | · |
| | · |
| | · |

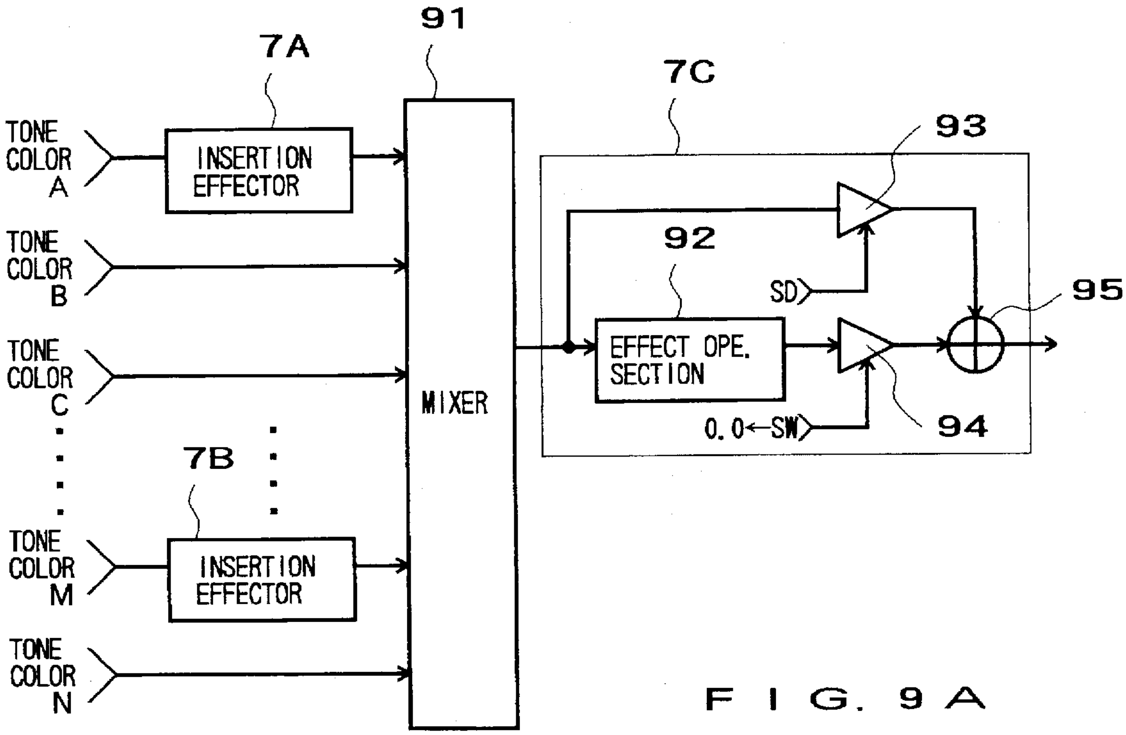
FIG. 9A
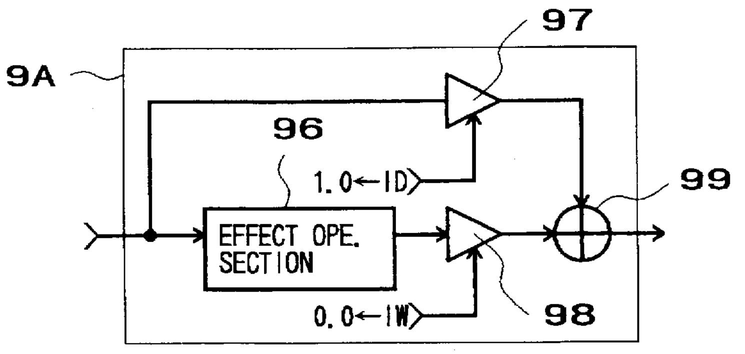
FIG. 9B
| 7A | 7B | 7C |
|---|---|---|
| 1 | 1 | 0 |
FIG. 9C

ELECTRONIC MUSICAL INSTRUMENT HAVING AN EFFECT DATA CONVERTING FUNCTION

BACKGROUND OF THE INVENTION

The present invention relates generally to electronic musical instruments which generate a tone on the basis of tone control information supplied from the outside, and more particularly to such an electronic musical instrument which, even when a sound effect designated by effect data contained in tone control information supplied from the outside is not impartable by the musical instrument, is capable of properly imparting a sound effect approximate to the designated sound effect.

In general, electronic musical instruments control the pitch, color, effect etc. of a tone to be generated, by using, as tone control information to be shared among different types of instruments, information expressed in accordance with MIDI (Musical Instrument Digital Interface) standards (i.e., MIDI information).

Many types of such MIDI-based musical instruments are in use today, from a low-grade type which can provide a relatively small number of pitches (narrow range), tone colors and effects to a high-grade type which can provide a far greater number of pitches (wide range), tone colors and effects. Thus, it is often possible that compatible use of the MIDI information can not be achieved between different type instruments.

Even if the musical instruments sharing the MIDI information are of a generally same type, compatibility of the MIDI information may be lost with regard to generatable tone color and impartable sound effect where the instruments are made by different manufacturers, as well as where the instruments are made by a same manufacturer if the specifications and year of manufacturing differ among the individual instruments.

In order to eliminate such inconveniences, the electronic musical instrument disclosed in Japanese Patent Publication No. HEI 4-7519 is provided with a conversion means for converting or changing tone control information on pitch, tone color and effect supplied from an upper-grade instrument into another data form that can be generated by a tone generation means of the lower-grade instrument, so as to generate a tone on the basis of the converted data.

However, in the disclosed technique, there must be predetermined correspondency between tone color data operable by the upper-grade instrument and tone color data operable by the lower-grade instrument. Namely, the number of tone colors operable by the upper-grade instrument must be an integer multiple of the number of tone colors operable by the lower-grade instrument. Further, in the disclosed technique, effect data inoperable by the lower-grade instrument is merely prevented from being supplied to the lower-grade instrument. Therefore, where there is no correspondency in tone color data between the data sending and receiving instruments of different types or where there exists effect data inoperable by the receiving instrument, compatibility of the MIDI information will be lost as with the traditional technique.

SUMMARY OF THE INVENTION

It is therefore an object of the present invention to provide an electronic musical instrument which is capable of imparting an optimum effect even when effect data inoperable by the musical instrument is received from another type instrument.

It is another object of the present invention to provide an electronic musical instrument which is capable of performing optimum data conversion, considering a combination of tone color and effect.

In order to accomplish the above-mentioned objects, the present invention provides an electronic musical instrument which comprises an introduction section for introducing, from the outside, tone control information containing effect data designating a sound effect, a tone generation section for generating a tone in accordance with the tone control information introduced via the introduction section, and an effect data conversion section for, when the effect data contained in the tone control information introduced via the introduction section designates a first sound effect not impartable by the tone generation section, converting the introduced effect data into another data and supplying the converted data to the tone generation section in place of the introduced effect data designating the first sound effect, the effect data conversion section including a table which classifies predetermined sound effects impartable by the tone generation section into plural groups in accordance with individual characteristics of the predetermined sound effects and stores for each of the groups effect data indicative of sound effect belonging to the group, the effect data conversion section, by referring to the table, ascertaining whether or not the effect data introduced via the introduction section designates the first sound effect not impartable by the tone generation section and, if the introduced effect data designates the first sound effect, extracting from the table the effect data indicative of a second sound effect belonging to one of the groups which corresponds to a characteristic of the first sound effect, so as to supply the tone generation section with the extracted effect data indicative of the second sound effect as the converted data.

The tone generation section generates a tone in accordance with the tone control information introduced from the outside (for instance, from another type electronic musical instrument) via the introduction section. Thus, if the introduced tone control information contains effect data designating a sound effect that is impartable by the tone generation section, the tone generation section can directly impart a tone with the sound effect corresponding to the effect data. However, if the introduced tone control information contains effect data designating a sound effect that is not impartable by the tone generation section, the generation section can not directly impart a tone with that sound effect.

So, according to the present invention, where the effect data contained in the tone control information introduced via the introduction section designates a first sound effect that is not impartable by the tone generation section, the effect data conversion section operates to change the effect data into another effect data and supplying the other effect data to the tone generation section. The effect data conversion section includes a table which classifies predetermined sound effects impartable by the tone generation section into plural groups in accordance with individual characteristics of the sound effects and stores for each of the groups effect data indicative of every sound effect belonging to the group. By referring to the table, the effect data conversion section ascertains whether or not the effect data introduced via the introduction section designates the first sound effect not impartable by the tone generation section and, if so, extracts from the table effect data indicative of a second sound effect belonging to one of the groups which corresponds to a characteristic of the first sound effect, so as to supply the tone generation section with the thus-extracted effect data indicative of the second sound effect in place of the effect data designating the first sound effect. In such a case where effect data is exchanged between different type instruments, even if the electronic musical instrument receives effect data designating a sound effect that is not impartable thereby, the above-mentioned arrangement makes it possible to impart an impartable sound effect, in place of the designated sound effect, belonging to one of the groups which corresponds to the characteristic of the designated sound effect. This permits proper impartment of a sound effect approximate to the designated sound effect.

The present invention further provides an electronic musical instrument which comprises an introduction section for introducing, from outside, tone control information containing effect data designating a sound effect and tone color data designating a tone color, a tone generation section for generating a tone in accordance with the tone control information introduced via the introduction section, an effect data conversion section for, when the effect data contained in the tone control information introduced via the introduction section designates a sound effect not impartable by the tone generation section, changing the effect data into other data and supplying the other data to the tone generation section, a tone color data conversion section for, when the tone color data contained in the tone control information introduced via the introduction section designates a tone color not generatable by the tone generation section, changing the tone color data into another tone color data designating another tone color and supplying the other tone color data to the tone generation section, and a control section for, when there has been a change in at least one of the sound effect and tone color data by at least one of the effect data and tone color data conversion section, determining whether or not a combination of sound effect and tone color based on the change falls under a predetermined inhibition condition and, if the combination of sound effect and tone color based on the change falls under the predetermined inhibition condition, again changing the one of the sound effect and tone color data so that the combination does not fall under the inhibition condition any longer.

Thus, in such a case where effect data and tone color data are exchanged between the musical instrument and another type instrument, even if the electronic musical instrument receives effect data or tone color data designating a sound effect or tone color that is not impartable or generatable thereby, the above-mentioned arrangement makes it possible to perform proper conversion or change in the effect or tone color, thereby permitting appropriate tone generation and effect impartment without causing any significant problems. Besides, because it is ascertained whether or not a combination of the sound effect and tone color after the change falls under a predetermined inhibition condition and data conversion is performed to avoid the combination falling under the inhibition condition, a tone can be performed in a suitable combination of tone color and sound effect with no sense of incongruity or inharmoniousness.

The present invention still further provides an effect imparting device which comprises an effect impartment section for imparting a sound signal a sound effect selected from among a plurality of predetermined sound effects, an effect designation section for designating a sound effect, and a control section for classifying the sound effect designated by the effect designation section as any of a first class of effect impartable by the effect impartment section, a second class of effect not impartable by the effect impartment section but changeable for another sound effect that is impartable by the effect impartment section and a third class of effect not impartable by the effect impartment section and not changeable for another sound effect that is impartable by the effect impartment section, the control section instructing the effect impartment section to impart the designated sound effect when the designated effect belongs to the first class, instructing the effect impartment section to impart the other sound effect when the designated effect belongs to the second class, and instructing the effect impartment section to impart no sound effect when the designated effect belongs to the third class.

If the introduced tone control information contains effect data designating a sound effect that is not impartable by the tone generation section, the generation section can not directly impart a tone with that sound effect, and thus, as previously noted, it is preferable to impart another appropriate tone effect impartable thereby in place of the designated or original sound effect. But, if the original sound effect has strong individuality or peculiarity, to compulsorily change the original sound effect for another one not so similar thereto may rather cause an unwanted sense of incongruity. So, in the above-mentioned arrangement, the third class of effect is considered in such a manner that no sound effect is imparted when the designated sound effect belongs to the third class, so that a tone can be performed with no sense of incongruity.

The present invention still further provides an effect imparting device which comprises an introduction section for introducing, from outside, effect data designating a desired sound effect, an effect impartment section for imparting a sound signal with a sound effect based on the effect data introduced via the introduction section, and an effect data conversion section for, when the effect data introduced via the introduction section designates a sound effect not impartable by the effect impartment section, converting said introduced effect data into another effect data designating another sound effect impartable by the effect impartment section and supplying the converted effect data to the effect impartment section, in place of said introduced effect data, so as to cause said effect impartment section to impart the sound signal with the other sound effect designated by said converted effect data.

Now, the preferred embodiment of the present invention will be described in detail below with reference to the accompanying drawings.

BRIEF DESCRIPTION OF THE DRAWINGS

In the drawings:

Fig. 9A is a block diagram illustrating a structural example of the effector of FIG. 2;

FIG. 9B is a block diagram illustrating a structural example of an insertion effector of FIG. 9A;

FIG. 9C is a diagram showing an example of effect block flags corresponding to the arrangement of FIG. 9A.

DETAILED DESCRIPTION OF THE PREFERRED EMBODIMENT

Figure 1:
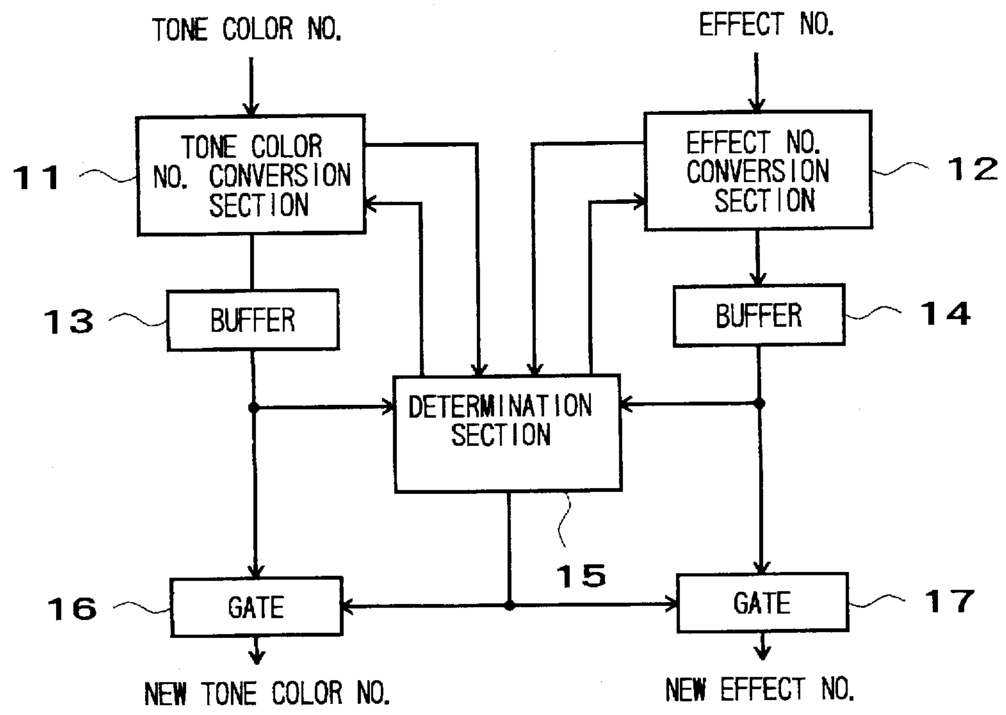
FIG. 1 is a functional block diagram illustrating an example of processing performed by a control section of FIG. 2.
Figure 2:
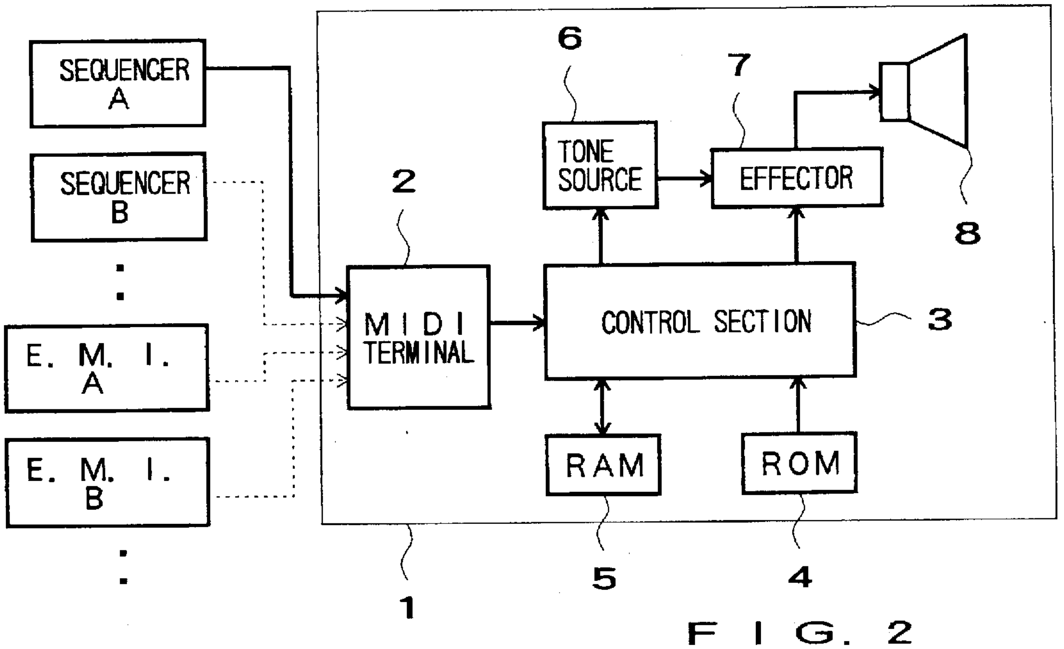
FIG. 2 is a block diagram illustrating the general configuration of an electronic musical instrument in accordance with an embodiment of the present invention.

FIG. 2 is a block diagram illustrating the general configuration of an electronic musical instrument in accordance with an embodiment of the present invention, which comprises a MIDI (Musical Instrument Digital Interface) terminal 2, a control section 3, a ROM 4, a RAM 5, a tone source 6, an effector 7 and a sound system 8. The MIDI terminal 2 is an interface through which tone control information (MIDI data conforming to the MIDI standards, such as note-on and note-off messages, velocity data, pitch data, tone color number, effect number, etc.) is supplied from an external MIDI instrument to the control section 3. Although sequencers A, B, . . . and electronic musical instruments A, B, . . . are shown in FIG. 1 as MIDI instruments connected to the control section 3 via the MIDI terminal 2, other MIDI instruments may of course be connected as long as they output tone control information as mentioned above.

The control section 3 comprises a microcomputer, which controls the entire operation of the electronic musical instrument 1 on the basis of various programs and data contained in the ROM 4 and RAM 5 and the tone control information received from the outside via the MIDI terminal 2. Namely, the control section 3, on the basis of the tone control information, supplies the tone source 6 with velocity data, pitch data and a tone color number and supplies the effector 7 with an effect number. If the tone color and effect numbers contained in the MIDI data received via the MIDI terminal 2 are inoperable (or can not be handled) by the tone source 6 and effector 7, then the control section 3, on the basis of a table provided in the RAM 5, converts such tone color and effect numbers into a form (new tone color and effect numbers) operable by the tone source 6 and effector 7 and supplies the thus-converted numbers to the tone source 6 and effector 7. The conversion of the tone color and effect numbers performed by the control section 3 will be described later. Other peripherals than shown in FIG. 2, such as a timer, display and switch panel are connected to the control section 3.

The ROM 4 prestores various programs and data and comprises a read-only memory (ROM). The RAM 5 is for temporarily storing various data occurring as the control section 3 executes the programs and is provided in a predetermined area of a random access memory (RAM) for use as registers, flags, buffers, tables, etc.

The tone source 6 is capable of simultaneously generating plural tone signals in plural channels. The tone source 6 receives the tone control information (any of note-on and note-off messages, velocity data, pitch data, tone color number data, etc.) from the control section 3, generates a tone signal on the basis of the received information and supplies the effector 7 with the generated tone signal. The tone source 6 may employ any of the known tone signal generation techniques such as: the memory readout method where tone waveform sample value data stored in a waveform memory are sequentially read out in accordance with address data varying in response to the pitch of a tone to be generated; the FM method where tone waveform sample value data are acquired by performing predetermined frequency modulation operations using the above-mentioned address data as phase angle parameter data; and the AM method where tone waveform sample value data are acquired by performing predetermined amplitude modulation operations using the above-mentioned address data as phase angle parameter data.

The effector 7 imparts to the tone signal from the tone source 6 a sound effect corresponding to the effect number given from the control section 3, and outputs the effect-imparted tone signal to the sound system 8. The sound system 8 comprises amplifiers and speakers and audibly reproduces or sounds the effect-imparted tone signal supplied from the effector 7.

Figure 3A:
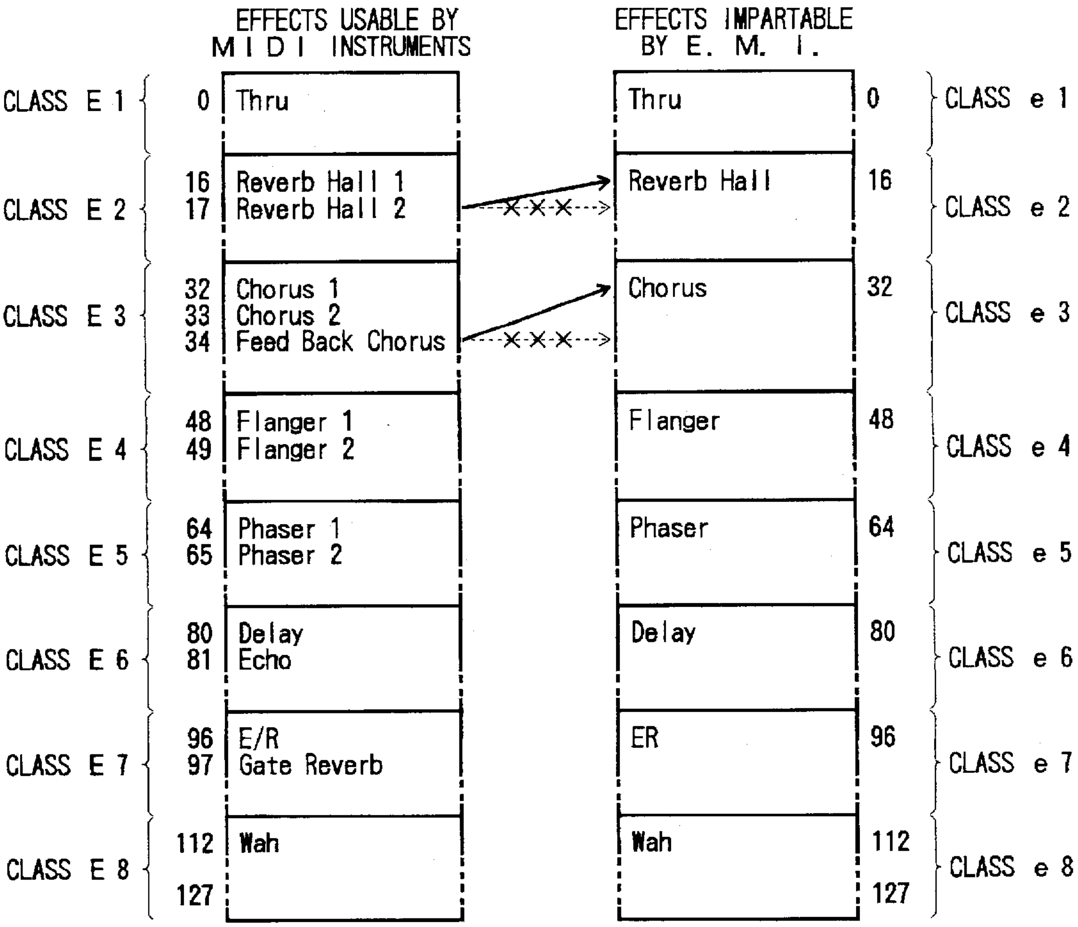
FIG. 3A is a diagram showing an example of a conversion table for converting an effect number into a form operable by an effector of FIG. 2.
Figure 3B:
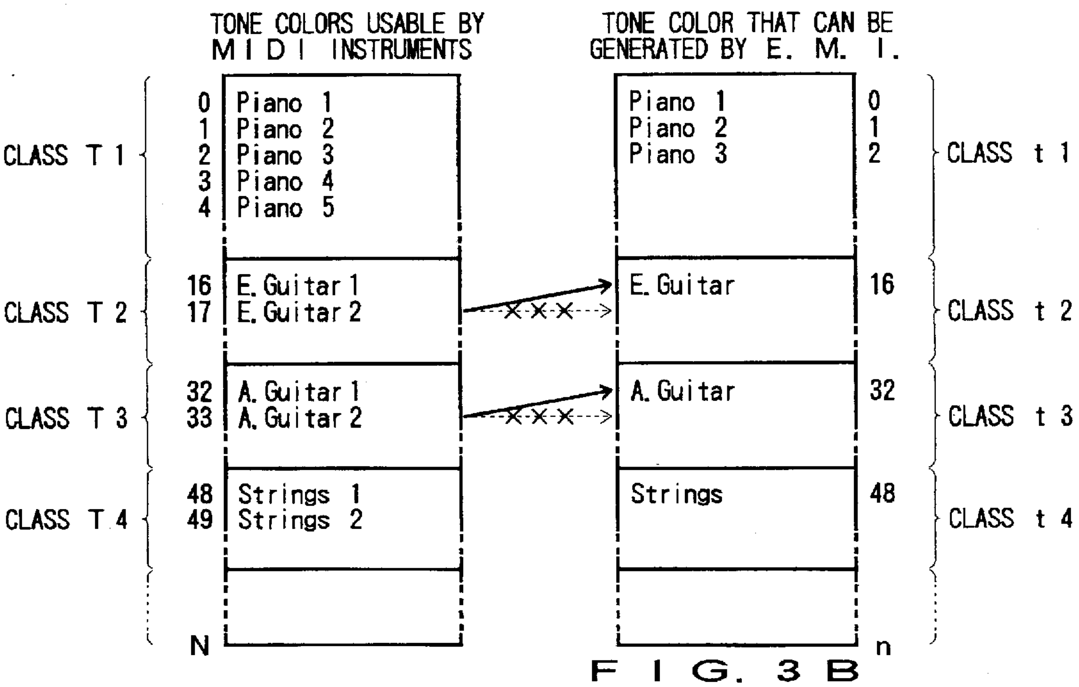
FIG. 3B is a diagram showing an example of a conversion table, similar to the table of FIG. 3A, for tone color number conversion.

FIG. 3 shows exemplary conversion tables for converting the tone color and effect numbers into a form operable by the tone source 6 and effector 7. More specifically, FIG. 3A shows a conversion table for the effect number, whereas FIG. 3B shows a conversion table for the tone color number. These tables are contained in the RAM 5. In the figures, there are a total of 128 effects usable by various types of MIDI instruments. Some of the instruments may be capable of using all the 128 effects and others may be capable of using just some of the 128 effects. Eight of the 128 effects are usable or operable (i.e., impartable) by the electronic musical instrument 1. Unique effect numbers from "0" to "127" are allocated individually to the 128 effects so that each of the effect numbers directly indicates a different sound effect. For example, in the embodiment, effect number "16" corresponds to an effect "Reverb Hall 1", and effect number "17" corresponds to an effect "Reverb Hall 2". Likewise, other effect numbers "18" to "127" correspond to respective other effects.

Effect numbers "0" to "15" correspond to effects that are not common to all the types of the instruments, such as those prepared by the user. Accordingly, in this embodiment, such special effects are treated as a through-effect which will be passed on to a next stage without being imparted by the instrument 1. Further, highly individual or peculiar effects which are not among those of effect numbers "18" to "127" may result in very unpleasant sound unless they are combined with specific tone colors, and thus are allocated any of effect numbers "0" to "15".

As previously noted, the 128 effects are classified into eight groups or classes "E1" to "E8" each including 16 effects. That is, class E1 includes effects of effect numbers "0" to "15", class E2 effect numbers "16" to "31", class E3 effect numbers "32" to "47", class E4 effect numbers "48" to "63", class E5 effect numbers "64" to "79", class E6 effect numbers "80" to "95", class E7 effect numbers "96" to "111", and class E8 effect numbers "112" to "127".

Similarly to the effects common to all the types of the instruments, effects impartable by the electronic musical instrument 1 are classified into eight groups or classes "e1" to "e8". Class "e1" includes through-effects which are not imparted by the instrument 1, as previously mentioned. Effects that can be imparted by the electronic musical instrument 1 are "Reverb Hall" of effect number "16" in class "e2", "Chorus" of effect number "32" in class "e3", "Flanger" of effect number "48" in class "e4", "Phaser" of effect number "64" in class "e5", "Delay" of effect number "80" in class "e6", "E/R" of effect number "96" in class "e7", and "Wah" of effect number "112" in class "e8".

Therefore, when any other effect number than the above-mentioned effect numbers "16", "32", "48", "64", "80", "96" and "112" has been received from any of the external MIDI instruments via the MIDI terminal 2, the following process is performed.

If an effect number indicative of an effect that can not be imparted by the musical instrument 1 has been received from any of the external MIDI instruments, the effect of the smallest effect number, i.e., impartable effect (basic effect) located at the head of the group containing the received non-impartable effect number is extracted on the basis of the conversion table of FIG. 3A and supplied to the tone source.

Namely, in each of the classes "e1" to "e8" there is only one effect that can be imparted by the electronic musical instrument 1, and hence if any of effect numbers "0" to "15" has been received, the electronic musical instrument 1 treats it as effect number "0", and if any of effect numbers "16" to "31" has been received, the electronic musical instrument 1 treats it as effect number "16". Similarly, if any of effect numbers "32" to "47" has been received, the electronic musical instrument 1 treats it as effect number "32"; if any of effect numbers "48" to "63" has been received, the electronic musical instrument 1 treats it as effect number "48"; if any of effect numbers "64" to "79" has been received, the instrument 1 treats it as effect number "64"; if any of effect numbers "80" to "95" has been received, the instrument 1 treats it as effect number "80"; if any of effect numbers "96" to "111" has been received, the instrument 1 treats it as effect number "96", and if any of effect numbers "112" to "127" has been received, the instrument 1 treats it as effect number "112".

Thus, if, for example, "Reverb Hall 2" of effect number "17" in class E2 has been received from any of the external MIDI instruments, "Reverb Hall" of effect number "16" in class e2 is supplied to the tone source 6. Further, if "Feedback Chorus" of effect number "34" in class E3 has been received, then "Chorus" of effect number 32" in class e3 is supplied to the tone source 6.

Next, the conversion table for the tone color number shown in FIG. 3B will be described.

In the figure, N effects are common to all the types of the instruments, and effects that are operable (tone colors that can be generated) by the electronic musical instrument 1 are only part of the common effects.

As with the effect number conversion table, the N tone colors are allocated individual unique tone color numbers "0" to "N" so that each of the numbers directly indicates a different tone color. For example, in the embodiment, tone color number "0" corresponds to a tone color "Piano 1", and tone color number "1" corresponds to a tone color "Piano 2". Likewise, other tone color numbers "2" to "N" correspond to respective other tone colors. As with the effects, tone colors that are not common to all the types of the instruments, such as those prepared by the user, may be treated as a through-tone-colors.

The N tone colors are classified into groups or classes "T1" to "TN" each including 16 tone colors. That is, class "T1" includes piano tone colors of numbers "0" to "15", class "T2" electric guitar tone colors of numbers "16" to "31", class "T3" acoustic guitar tone colors of numbers "32" to "47", and class "T4" strings tone colors of numbers "48" to "63". Although not specifically shown, classes "T5" to "TN" each include various tone colors similarly to the above-mentioned classes.

Similarly to the tone colors common to all the types of the instruments, tone colors that can be generated by the electronic musical instrument 1 are classified into classes "t1" to "tn".

Class "t1" includes piano tone colors as with class "T1", of which "Piano 1" corresponds to tone color number "0", "Piano 2" corresponds to tone color number "1", and "Piano 3" corresponds to tone color number "2". However, for other tone color numbers "3" to "15", there are no corresponding tone colors since they can not be generated. Class "t2" concerns electric guitar tone color as with class "T2", in which only "E. Guitar" corresponds to tone color number "16" and no corresponding tone colors are present for other tone color numbers "17" to "31". Class "t3" concerns acoustic guitar tone color as with class "T3", in which only "A. Guitar" corresponds to tone color number "32" and no corresponding tone colors are present for other tone color numbers "33" to "47". Class "t4" concerns strings tone color as with class "T4", in which only "Strings" corresponds to tone color number "48" and no corresponding tone colors are present for other tone color numbers "49" to "63". Although not specifically shown, classes "t5" to "tn" concern tone colors similar to those of class "T5" to "TN".

Therefore, when any other tone color number than the above-mentioned numbers "0", "1", "2", "16", "32", "48", . . . has been received from any of the external MIDI instruments via the MIDI terminal 2, the following process is performed.

If a tone color number indicative of a tone color that can not be generated by the musical instrument 1 has been received from the external MIDI instrument, the tone color of the smallest tone color number, i.e., generatable tone color (basic tone color) located at the head of the class containing the non-generatable tone color number is extracted on the basis of the conversion table of FIG. 3B and supplied to the tone source 6.

Namely, class"t1" includes three tone colors that can be generated by the electronic musical instrument 1 and each of other classes "t2" to "tn" has only one such tone color, so that if any of tone color numbers "3" to "15" has been received, the electronic musical instrument 1 treats it as tone color number "0". Similarly, if any of tone color numbers "16" to "31" has been received, the instrument 1 treats it as tone color number "16"; if any of effect numbers "32" to "47" has been received, the instrument 1 treats it as effect number "32", and if any of effect numbers "48" to "63" has been received, the instrument 1 treats it as effect number "48".

Thus, if, for example, "Piano 2" of tone color number "1" in class T1 has been received from the external MIDI instrument, "Piano 2" of tone color number "1" in class t2 is supplied to the tone source 6. Further, if "E. Guitar 2" of tone color number "17" in class T2 has been received from the external MIDI instrument, "E. Guitar" of tone color number "16" in class t2 is supplied to the tone source 6.

Figures 4, 5A, 5B:
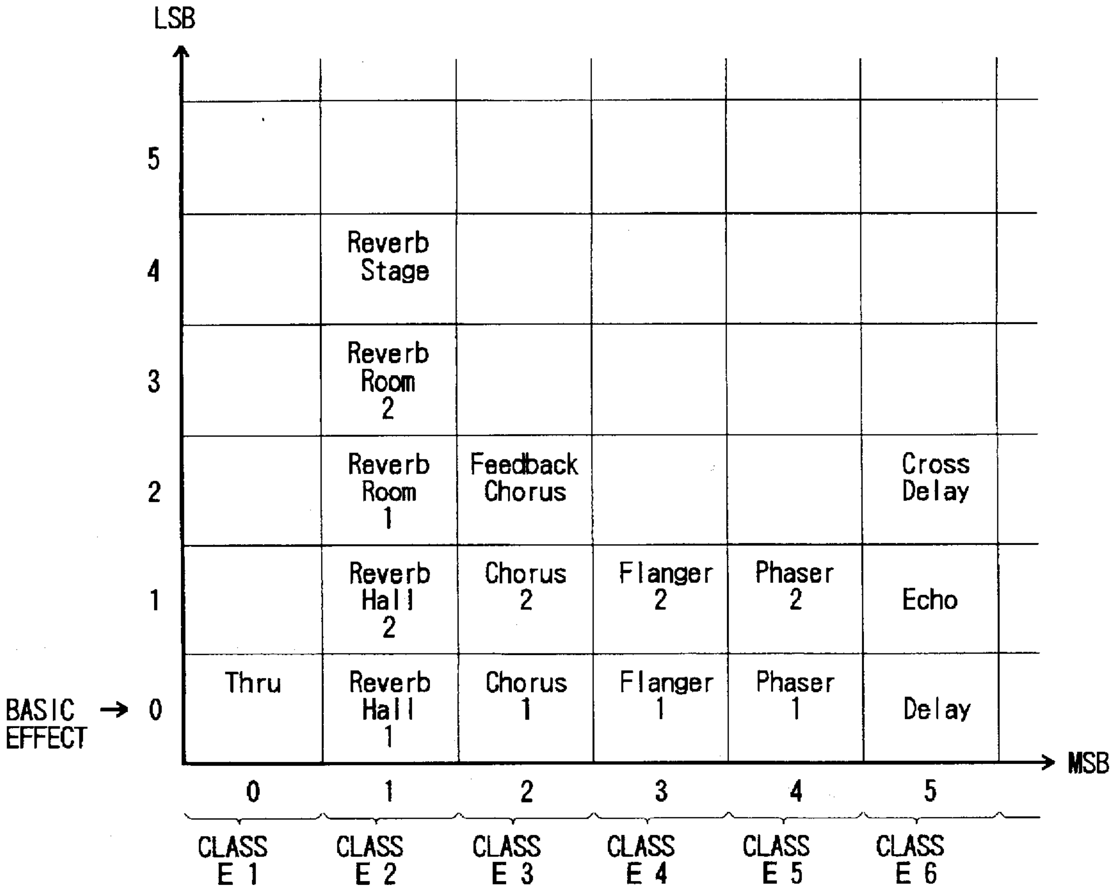
FIG. 4 is a diagram showing another example of the effect number conversion table of FIG. 3A.
FIG. 5A is a diagram showing an example of a combination inhibition table indicating inhibited combinations of tone color and converted effect, effect and converted tone color, and converted tone color and converted effect.
FIG. 5B is a diagram showing another example of the combination inhibition table.

FIG. 4 shows another example of the conversion table of FIG. 3.

The example of FIG. 3 has been described as constructed in such a manner to determine which of the classes of the conversion table the received effect number or tone color number belongs and to convert it into a new effect or tone color number in the determined class. In contrast, the conversion table of FIG. 4 contains, in each effect or tone color number, data identifying a class. Namely, while each effect number in the example of FIG. 3 is one-byte data which merely indicates an effect, each effect number in the example of FIG. 4 is two-byte data, of which a first byte indicates a class and a second byte indicates an effect variation.

The conversion table of FIG. 4 presents an effect matrix where the horizontal axis represents values "0" to "5" expressed by the first byte MSB and the vertical axis represents values "0" to "5" expressed by the second byte LSB. Values "0", "1", "2", "3", "4" and "5" expressed by the first byte correspond to classes "E1", "E2", "E3", "E4", "E5" and "E6", respectively, of the example of FIG. 3. Values expressed by the second byte represent effect variations belonging to the respective classes.

For instance, an effect number specified by MSB="0" signifies a through-effect as does class E1 of FIG. 3.

An effect number specified by MSB="1" and LSB="0" signifies effect "Reverb Hall 1". Similarly, an effect number specified by MSB="1" and LSB="1" signifies effect Reverb Hall 2", an effect number specified by MSB="1" and LSB="2" signifies effect "Reverb Room 1", an effect number specified by MSB="1" and LSB="3" signifies effect "Reverb Room 2", and an effect number specified by MSB="1" and LSB ="4" signifies effect "Reverb Stage". However, for MSB=1, no effects corresponding to effect number LSB≧5 are operable by the musical instrument 1 and hence are not contained in the table.

Further, an effect number specified by MSB="2" and LSB ="0" signifies effect "Chorus 1", an effect number specified by MSB="2" and LSB="1" signifies effect "Chorus 2", and an effect number specified by MSB="2" and LSB="2" signifies effect "Feedback Chorus". However, for MSB=2, no effects corresponding to effect number LSB≧3 are contained in the table.

Further, an effect number specified by MSB="3" and LSB ="0" signifies effect "Flanger 1", and an effect number specified by MSB="3" and LSB="1" signifies effect "Flanger 2". However, for MSB=3, no effects corresponding to effect number LSB≧2 are contained in the table.

Further, an effect number specified by MSB="4" and LSB ="0" signifies effect "Phaser 1", and an effect number specified by MSB="4" and LSB="1" signifies effect "Phaser 2". However, for MSB=4, no effects corresponding to effect number LSB≧2 are contained in the table.

Similarly, an effect number specified by MSB="5" and LSB="0" signifies effect "Delay", an effect number specified by MSB="5" and LSB="1" signifies effect "Echo", and an effect number specified by MSB="5" and LSB ="2" signifies effect "Cross Delay". However, for MSB=5, no effects corresponding to effect number LSB≧3 are contained in the table.

Accordingly, where any of the effect numbers that do not constitute the effect conversion table of FIG. 4, i.e., any of the effect numbers specified by MSB=1 and LSB≧5, MSB=2 and LSB≧3, MSB=3 and LSB≧2, MSB=4 and LSB ≧2 and MSB=5 and LSB≧3, has been received from any of the external MIDI instruments via the MIDI terminal 2, an effect specified by LSB=0 for the corresponding MSB value is extracted and then supplied to the tone source 6.

If, for example, effect number MSB="2" and LSB="1" has been received from the external MIDI instrument, effect "Chorus 2" of effect number MSB="2" and LSB="1" is supplied to the tone source 6. If effect number MSB="5" and LSB="4" has been received from the external MIDI instrument, effect "Delay" of effect number MSB="5" and LSB="0" is supplied to the tone source 6.

Although not shown specifically, a tone color conversion table may be prepared, similarly to the effect number conversion table of FIG. 4, in a matrix configuration such that the first byte (MSB) indicates a class and the second byte (LSB) indicates a tone color variation.

FIG. 5 shows a combination inhibition table which indicates inhibited combinations of tone color and converted effect, effect and converted tone color, and converted tone color and converted effect.

This combination inhibition table is composed of pairs of names of tone color and effect that can not be combined together. For example, FIG. 5A shows that effects "Distortion", "Flanger", . . . are inhibited from being combined with tone color names "Piano 1" to "Piano 5", and 5B shows that effects "Echo", . . . are inhibited from being combined with tone color name "Violin".

The inhibition of combination applies only to cases where the effect and tone color numbers have been converted via the conversion table. Thus, if tone color and effect numbers whose combination is inhibited has been received from the external MIDI instrument and no conversion via the conversion table is necessary, there will be generated a tone corresponding to the tone color and effect numbers which have not been converted.

FIG. 1 is a functional block diagram illustrating functions performed by the control section 3 in a process which, on the basis of the conversion tables in the RAM 5, converts a tone color number and an effect number received via the MIDI terminal 2 into a form operable by the tone source 6 and effector 7 (new tone color number and new effect number).

A tone color conversion section 11 converts the received tone color number on the basis of the tone color conversion table as shown in FIG. 3B and provides a buffer 13 with a tone color number that can be generated by the tone source 6 of the musical instrument 1. More specifically, if the received tone color number is one that can be generated by the tone source 6, it is output directly to the buffer 13 without being converted via the tone color conversion table. If, however, the received tone color number is one that can not be generated by the tone source 6, it is converted by use of the tone color conversion table and the resultant converted tone color number is output to the buffer 13.

Similarly, an effect number conversion section 12 converts the received effect number on the basis of the effect conversion table as shown in FIG. 3A and provides a buffer 14 with an effect number that can be imparted by the effector 7 of the musical instrument 1. More specifically, if the received effect number is one that can be imparted by the effector 7, it is output directly to the buffer 14 without being converted via the effect conversion table. If, however, the received effect number is one that can not be imparted by the effector 7, it is converted by use of the effect conversion table and the resultant converted effect number is output to the buffer 14.

A determination section 15 determines whether a combination of the tone color and effect numbers temporarily held in the buffers 13 and 14 is among those combinations inhibited by the inhibition table. On the basis of the determination result, the determination section 15 instructs the tone color number conversion section 11 to change the tone color number and instructs the effect number conversion section 12 to change the effect number. Upon receipt of the instruction to change the tone color number from the determination section 15, the tone color number conversion section 11 provides the buffer 13 with a next tone color in the class in question in accordance with the tone color conversion table of FIG. 3B. In the event that no other tone color is present in the class in question, a signal indicating that the instructed change is impossible is given to the determination section 15.

Upon receipt of the instruction to change the effect number from the determination section 15, the effect conversion section 12 provides the buffer 14 with a next effect in the class in question in accordance with the effect conversion table of FIG. 3A. In the event that no other effect is present in the class in question, a signal indicating that the instructed change is impossible is given to the determination section 15.

Once a combination of tone color and effect numbers that is not inhibited by the combination inhibition table has been stored into the buffers 13 and 14, the determination section 15 outputs a gate pulse to gates 16 and 17 to output new tone color and effect numbers to the tone source 6 and effector 7.

Next, processing performed by the determination section 15 will be described in detail.

Figure 6:
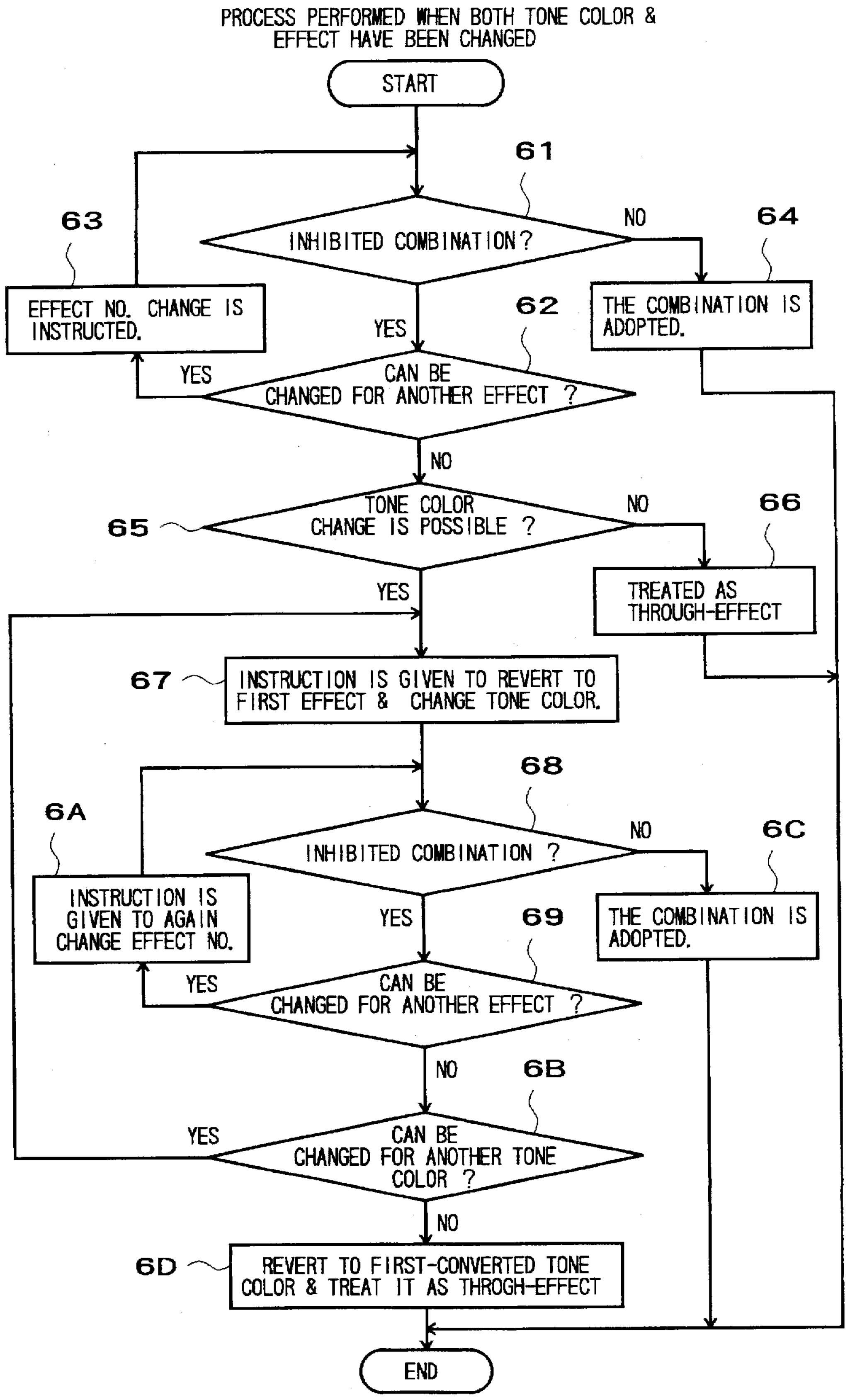
FIG. 6 is a flowchart illustrating an example of processing performed by a determination section of FIG. 1 when both tone color and effect have been changed.

FIG. 6 is a flowchart illustrating an example of a process performed when both tone color and effect are changed.

Step 61: The determination section 15 determines whether a combination of the tone color and effect numbers temporarily held in the buffers 13 and 14 is among those combinations inhibited by the inhibition table of FIG. 5. If the determination is in the negative (NO), the flow goes to step 64, but if the determination is in the affirmative (YES), the flow goes to step 62.

Step 62: Because of the determination in the preceding step 61 that the combination temporarily held in the buffers is inhibited, it is further determined here whether the effect can be changed for another effect. This determination is executed on the basis of a signal from the effect number conversion section 12 indicating that the change is possible or impossible. Thus, when a signal indicating that the change is possible is received from the effect number conversion section 12, the determination section 15 determines in the affirmative, so that the flow goes to step 63; when a signal indicating that the change is impossible is received from the effect number conversion section 12, the determination section 15 determines in the negative, so that the flow goes to step 65.

Step 63: Because of the determination in step 62 that the effect can be changed for another effect, the determination section 15 instructs the effect number conversion section 12 to change the effect and then reverts to step 61. Thus, the effect number conversion section 12 provides the buffer 14 with a next effect in the class in question, in accordance with the effect conversion table of FIG. 3A or FIG. 4. Namely, through the operations of steps 61 to 63, it is determined whether a combination of the tone color number and effect number is inhibited by the combination inhibition table while sequentially changing the effect number, so that once a combination not inhibited by the combination inhibition table has appeared, the flow proceeds to step 64 to adopt the combination.

Step 64: Because it has been determined in step 61 that the combination of the tone color and effect number is not inhibited by the combination inhibition table, the determination section 15 adopts that combination, and thus outputs a gate pulse to the gates 16 and 17 so as to provide the tone source 6 and effector 7 with new tone color and effect numbers.

Step 65: Since it has been found through the determination operations of steps 61 and 62 that no effect number exists which can be combined with the first tone color number, a further determination is made in this step as to whether the tone color can be changed for another one. This determination is made on the basis of a signal from the tone color conversion section 11 indicating that the intended change is possible or impossible. Thus, when a signal indicating that the change is possible is received from the tone color conversion section 11, the determination section 15 determines in the affirmative, so that the flow goes to step 67; when a signal indicating that the change is impossible is received from the tone color conversion section 11, the determination section 15 determines in the negative, so that the flow goes to step 66.

Step 66: Because step 61 has determined the combination is inhibited, step 62 has determined that the effect can not be changed for another one and step 65 has determined that the tone color can be changed for another one, the effect is treated in this step as a through-effect to prevent impartment of the effect.

Step 67: Because step 65 has determined that the tone color can be changed for another one although step 61 has determined the combination as inhibited and step 62 has determined that the effect can not be changed for another one, the determination section 15 instructs the effect number conversion section 12 to revert to the first effect and instructs the tone color number conversion section 11 to change the tone color. In response to such instructions, the tone color number conversion section 11 outputs a next tone color number in the class in question to the buffer 13 in accordance with the tone color conversion table of FIG. 3B, and the effect number conversion section 12 outputs the first effect number to the buffer 14.

Step 68: A determination is made here as to whether the combination of the tone color number converted in step 67 and the effect number held in the buffer 14 is inhibited by the combination inhibition table of FIG. 5. With a negative (NO) determination, the flow goes to step 6C, while with an affirmative (YES) determination, the flow proceeds to step 69.

Step 69: Since it has been determined in step 68 that the combination is inhibited, a further determination is made, similarly to step 62, as to whether the effect can be changed for another effect. If the determination section 15 determines in the affirmative, the flow goes to step 6A; otherwise, the flow goes to step 6B.

Step 6A: Because of the determination in step 69 that the effect can be changed for another effect, the determination section 15 instructs the effect conversion number conversion section 12 to again change the effect and then reverts to step 68. In response to this, the effect number conversion section 12 provides the buffer 14 with a next effect in the class in question, in accordance with the effect conversion table of FIG. 3A or 4.

Step 6B: Since it has been found through the determination operations of steps 68 and 69 that no effect number exists which can be combined with the converted tone color number, a further determination is made in this step as to whether the tone color can be changed for another one. If the tone color can be changed for another one, the flow goes to step 67, but if not, the flow goes to step 6D.

Step 6C: Because of the determination in step 68 that the combination is not inhibited by the combination inhibition table (NO), the determination section 15 adopts that combination, and outputs a gate pulse to the gates 16 and 17 so as to provide the tone source 6 and effector 7 with the tone color and effect numbers held in the buffers 13 and 14.

Through the above-mentioned operations of steps 67 to 6B, it is determined whether a combination of the tone color number and effect number is inhibited by the inhibition table while sequentially changing the tone color number and/or the effect number, so that once a combination not inhibited by the combination inhibition table has appeared, the flow proceeds to step 6C to adopt that combination.

Step 6D: Irrespective of whether the tone color or effect has been changed, the flow arrives at this step as long as the combination is inhibited by the combination inhibition table. Thus, the determination section 15 restores the tone color number to the first-converted tone color and instructs the tone color and effect number conversion sections 11 and 12 to treat the effect as a through-effect.

Figure 7:
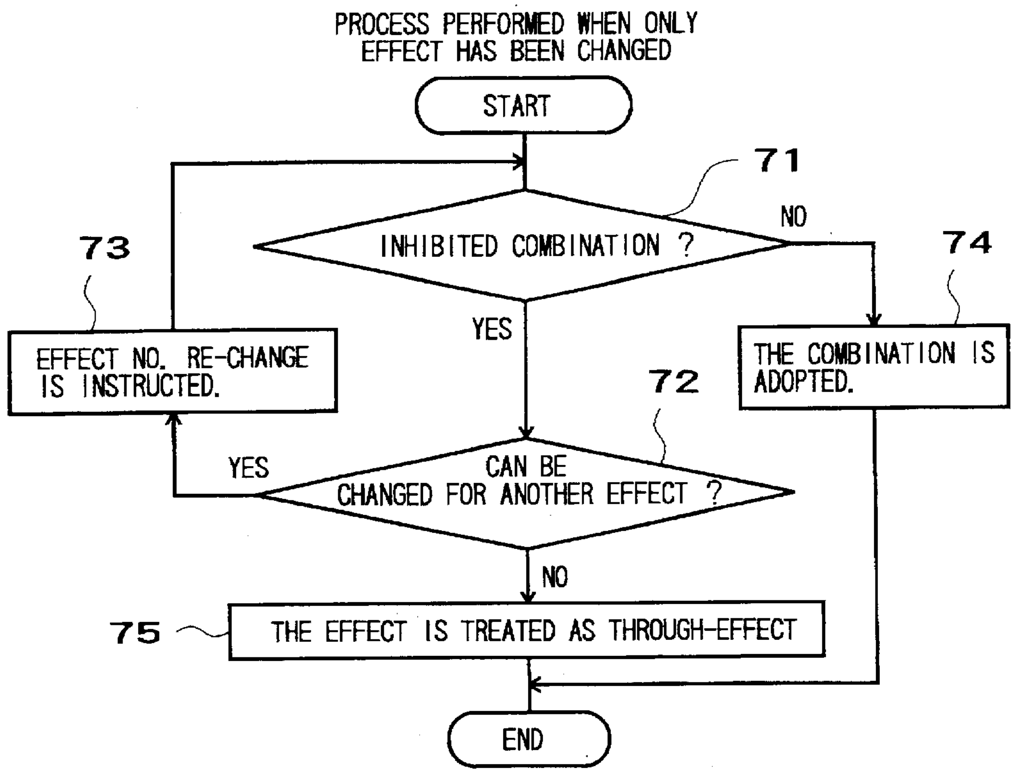
Fig. 7 is a flowchart illustrating an example of processing performed by the determination section of FIG. 1 when only effect has been changed.

FIG. 7 is a flowchart illustrating an example of a process performed when only effect has been changed. This process will be explained below step by step.

Step 71: The determination section 15 determines whether a combination of the tone color and effect numbers temporarily held in the buffers 13 and 14 is among those inhibited by the combination inhibition table of FIG. 5. If the determination is in the negative (NO), the flow goes to step 74, but if the determination is in the affirmative (YES), the flow goes to step 72.

Step 72: Because of the determination in step 71 that the combination temporarily held in the buffers is inhibited, it is further determined here whether the effect can be changed for another effect. If the effect can be changed (YES), the flow goes to step 73, but if not, the flow goes to step 75.

Step 73: Because of the determination in the preceding step 72 that the effect can be changed for another effect, the determination section 15 instructs the effect number conversion section 12 to re-change the effect and then reverts to step 71.

Step 74: Because it has been determined in step 71 that the combination of the tone color and effect numbers is not inhibited by the combination inhibition table, the determination section 15 adopts that combination, and thus outputs a gate pulse to the gates 16 and 17 so as to provide the tone source 6 and effector 7 with the tone color number and changed effect number as new tone color and effect numbers.

Step 75: Because step 71 has determined the combination as inhibited and step 72 has determined that the effect can not be changed for another one, the effect is treated in this step as a through-effect to prevent impartment of the effect.

As mentioned above, in the case where only effect has been changed, it is determined whether or not a combination of the tone color number and effect number is inhibited by the combination inhibition table while sequentially changing the effect number. Once a combination not inhibited by the combination inhibition table has appeared, the flow proceeds to step 74 to adopt that combination; where only inhibited combinations have appeared, the changed effect is treated as a through-effect so as not to perform impartment of the effect.

Figure 8:
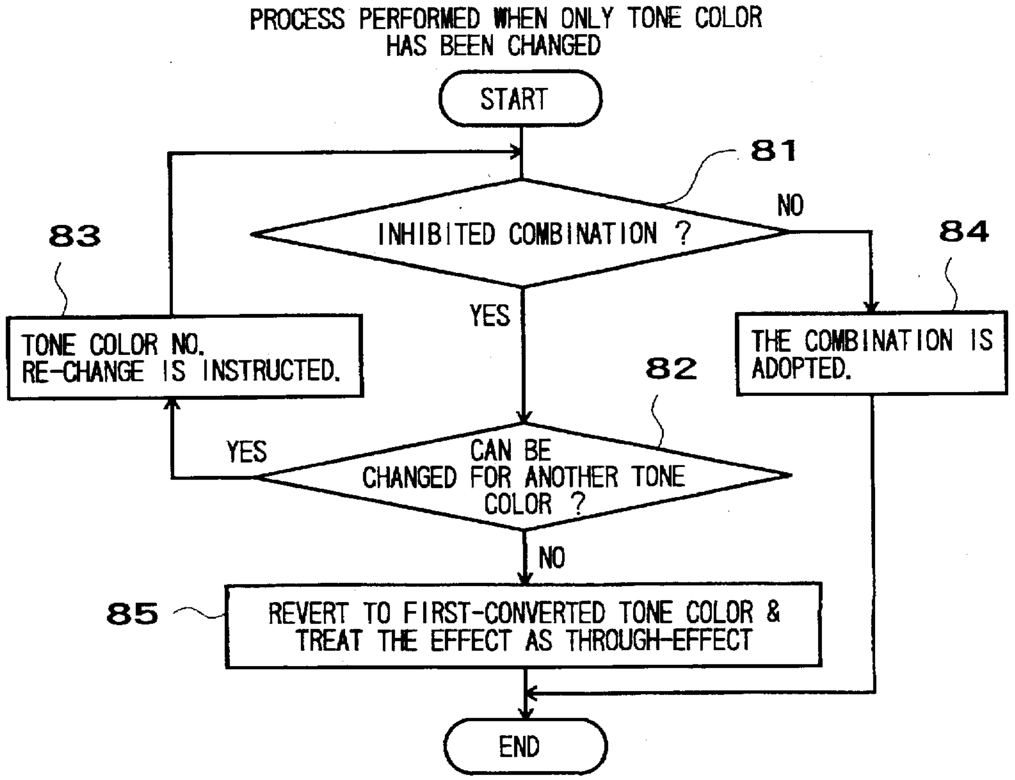
Fig. 8 is a flowchart illustrating an example of processing performed by the determination section of FIG. 1 when only tone color has been changed.

FIG. 8 is a flowchart illustrating an example of a process performed when only tone color has been changed. This process will be explained below step by step.

Step 81: The determination section 15 determines whether a combination of the tone color and effect numbers temporarily held in the buffers 13 and 14 is among those inhibited by the combination inhibition table of FIG. 5. If the determination is in the negative (NO), the flow goes to step 84, but if the determination is in the affirmative (YES), the flow goes to step 82.

Step 82: Because of the determination in the preceding step 81 that the combination temporarily held in the buffers is inhibited by the inhibition table, it is further determined here whether the tone color can be changed for another effect. If the tone color can be changed (YES), the flow goes to step 83, but if not, the flow goes to step 85.

Step 83: Because of the determination in step 82 that the tone color can be changed for another effect, the determination section 15 instructs the tone color number conversion section 11 to change the tone color and then reverts to step 81.

Step 84: Because it has been determined in step 81 that the combination of the tone color and effect numbers is not inhibited by the combination inhibition table, the determination section 15 adopts that combination, and thus outputs a gate pulse to the gates 16 and 17 so as to provide the tone source 6 and effector 7 with the effect number and changed tone color number as new effect and tone color numbers.

Step 85: Because step 81 has determined the combination as inhibited and step 82 has determined that the tone color can not be changed for another one, the determination section 15 reverts to the first-changed tone color and the effect is treated in this step as a through-effect to perform so as no to perform impartment of the effect.

As mentioned above, in the case where only tone color has been changed, it is determined whether or not a combination of the tone color number and effect number is inhibited by the combination inhibition table while sequentially changing the tone color number. Once a combination not inhibited by the inhibition table has appeared, the flow proceeds to step 84 to adopt that combination; where only inhibited combinations have appeared, the tone color change operation is terminated and the first-changed tone color is treated as a through-tone color so as not to perform impartment of the effect.

Next, with reference to FIG. 9, a description will be made how an effect-through operation is performed.

FIG. 9 is a block diagram illustrating the detailed structure of the effector of FIG. 2.

The effector 7 in this embodiment is constructed by setting microprograms and coefficients of a digital signal processor (DSP) as needed for the intended application. FIG. 9A is a block diagram illustrating an structural example of the effector 7 implemented by the DSP. According to this example, the DSP includes three effect blocks 7A, 7B and 7C, and the interconnection among these blocks is modified as needed to provided the effector as shown in FIG. 9A. In the illustrated example, the effect block 7A is assigned as an insertion effector for tone color A, the effect block 7B as an insertion effector for tone color M, and the effect block C as a system effector.

A mixer 91 operates to mix tone signals of plural channels corresponding to plural tone colors A to N in desired combinations by adjusting the volume of the individual signals, and the resultant mixed tone signal is output to the system effector 7C, which in turn imparts a desired sound effect as a system effect. Accordingly, a desired effect imparted in each channel ahead of the volume mixing mixer 91 is an insertion effect, and a desired common effect imparted after the mixer 91 is a system effect.

FIG. 9B shows the structure of the insertion effector 7A, which comprises an effect operation section 96, multipliers 97 and 98 and an adder 99. The effect operation section 96 imparts a predetermined effect corresponding to a selected effect number to a tone signal output from the tone source 6, and the resultant effect-imparted tone signal is supplied to a wet multiplier 98. The wet multiplier 98 multiplies the effect-imparted tone signal from the effect operation section 96 by a predetermined insertion wet coefficient IW, and outputs the resultant multiplied tone signal to the adder 99. On the other hand, the dry multiplier 97 multiplies the tone signal from the tone source 6 by a predetermined insertion dry coefficient ID, and outputs the resultant multiplied tone signal to the adder 99. The adder 99 adds together the signals from the wet and dry multipliers 98 and 97 and outputs the added result to the mixer 91.

The insertion effector 7B is generally similar in structure to the insertion effector 7A, except that the insertion wet and dry coefficients IW and ID and arithmetic operation performed in the effect operation section differ depending on an effect to be imparted.

The system effector 7C comprises an effect operation section 92, multipliers 93 and 94 and an adder 95. The effect operation section 92 imparts a predetermined effect corresponding to an effect number to the tone signal from the mixer 91, and the effect-imparted tone signal to a wet multiplier 94. The wet multiplier 94 multiplies the effect-imparted tone signal from the effect operation section 92 by a predetermined system wet coefficient SW, and outputs the resultant multiplied tone signal to the adder 95. On the other hand, the dry multiplier 93 multiplies the tone signal from the mixer 91 by a predetermined system dry coefficient SD, and outputs the resultant multiplied tone signal to the adder 95. The adder 95 adds together the signals from the wet and dry multipliers 94 and 93 and outputs the added result to the sound system 8.

FIG. 9C shows an effect block flag indicating to which of the system and insertion effectors the effect blocks 7A, 7B and 7C are assigned. The effect block flag at a value of "0" indicates the system effector, while the effector block flag at "1" indicates the insertion effector. Accordingly, in this illustrated example, the effect block flags for the effect blocks 7A and 7B are at "1", and the effect block flag for the effect block 7C is at "0".

The effect-through operation is performed in the thus-arranged effector in the following manner. Namely, if the effect to be passed through (to be treated as a through-effect) is an insertion effect, then the insertion wet coefficient IW is set to "0" (corresponding to zero effect) and the insertion dry coefficient ID is set to "1.0" (maximum value, i. e., predetermined effective value) as shown in FIG. 9B. This settings block passage of the effect-imparted tone signal from the effect operation section 96, but allows the tone signal from the tone source 6 to pass through the multiplier 97 at the maximum level (with no attenuation) and be input to the mixer 91. Changing both the coefficients in this manner is called an effect-through operation if the effect to be passed through is a system effect, the system wet coefficient SW is set to "0" (corresponding to zero effect), but the system dry coefficient SD is left unchanged. This settings block passage of the effect-imparted tone signal from the effect operation section 92, but allows the tone signal multiplied by the system dry coefficient SD from the mixer 91 to be input to the sound system 8 via the adder 95. Changing only the system wet coefficient SW to "0" in this manner is called a no-effect operation.

Figure 10:
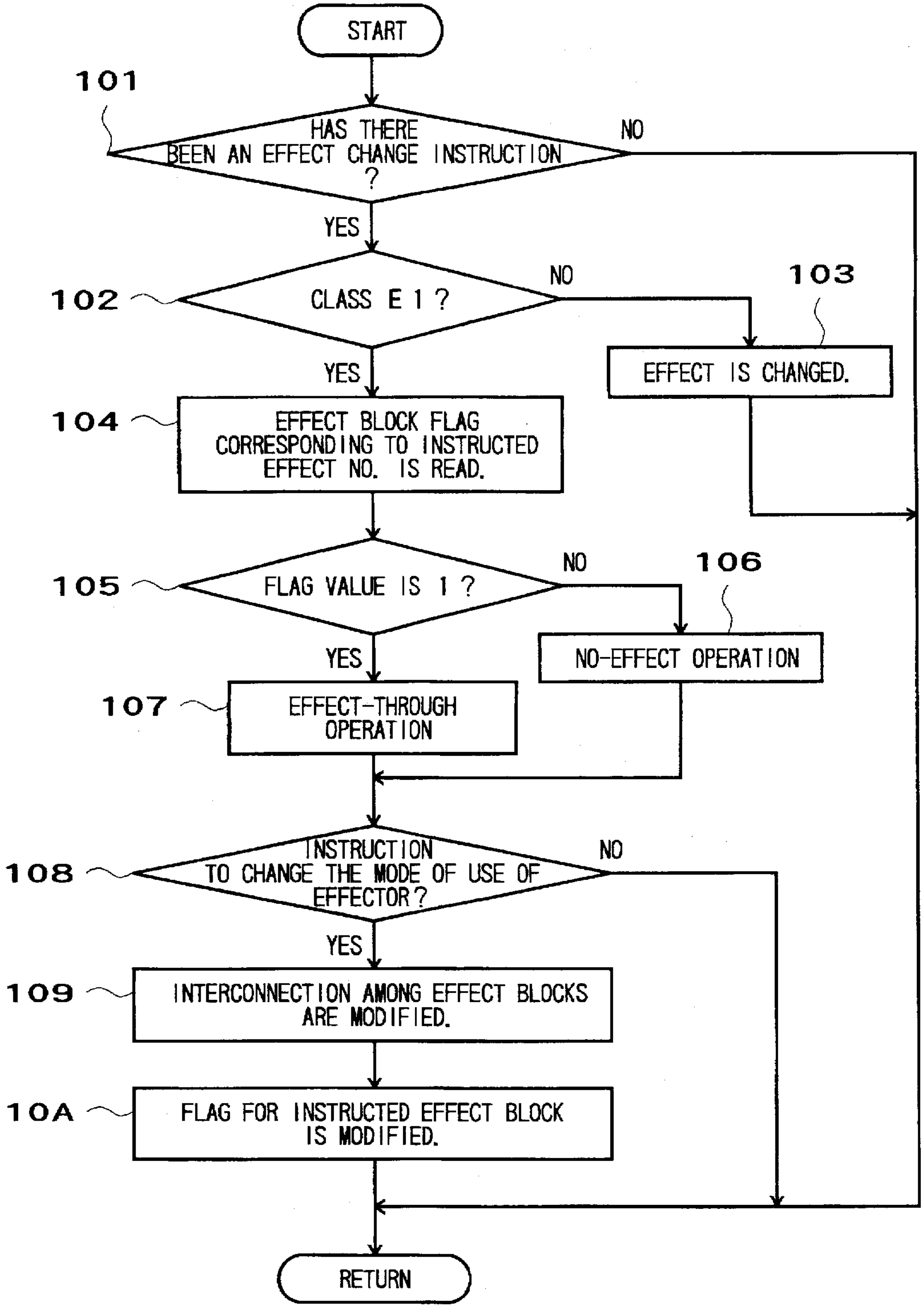
FIG. 10 is a flowchart illustrating an example of processing performed by the control section of FIG. 2 when effect has been changed.

FIG. 10 is a flowchart illustrating an example of processing performed by the control section 3 when effect has been changed. This processing will be explained below step by step.

Step 101: A determination is made as to whether the effect number received via the MIDI terminal 2 is one that can not be imparted by the effector 7 and whether there has been an effect change instruction to perform an effect change operation on the basis of the effect conversion table. If there has been such an instruction (YES), the flow proceeds to step 102, but if not, the flow returns to provides the buffer 14 with the effect number as received.

Step 102: It is further determined whether the effect number instructed in the preceding step 101 belongs to class "E1" in the conversion table of FIG. 3. If answered in the affirmative, the flow proceeds to step 104, but if the effect number belongs to another class (NO), the flow branches to step 103 to perform a normal effect conversion operation.

Step 103: The received effect number is changed for another one that is impartable by the effector 7 of the musical instrument 1 on the basis of the effect conversion table as shown in FIG. 3, which is then output to the buffer 14. More specifically, the smallest of impartable effect numbers, i.e., the impartable effect number (basic effect) located at the head of the class to which the impartable effect number belongs is extracted on the basis of the conversion table of FIG. 3A and is then written into the buffer 14.

Step 104: The determination in the preceding step 102 that the instructed effect number belongs to class "E1" means that the effect corresponding to the effect number is to be treated as a through-effect, and thus this step reads out the value of the effect block flag corresponding to the instructed effect number.

Step 105: A determination is made as to whether or not the read-out flag value is "1", i.e., whether the effector associated with the through-effect is an insertion effector. If it is "1" (YES), the flow proceeds to step 107, but if not, the flow branches to step 106.

Step 106: Because it has been determined in the preceding step 105 that the effector is a system effector, the no-effect operation is performed to set only the system wet coefficient SW to "0" with the system dry coefficient SD left unchanged as shown in FIG. 9A.

Step 107: Because it has been determined in the preceding step 105 that the effector is an insertion effector, the effect-through operation is performed to set the insertion wet coefficient IW to "0" and set the insertion dry coefficient ID to "1.0".

Step 108: It is determined whether, in addition to the above-mentioned instruction to change the effect number, there is an instruction to change the mode of use of the effector. With an affirmative determination, the flow proceeds to perform operations in and after step 109, but with a negative determination, the flow returns. To change "mode of use of the effector" means to change the interconnection among the effectors as shown in FIG. 9A.

Step 109: The interconnection among the three effect blocks 7A, 7B and 7C is modified as desired by the mixer 91.

Step 10A: In accordance with the interconnection modification in the preceding step, the values of the effect block flags of FIG. 9C are changed. For instance, if the effect block 7A is a system effector and the blocks 7B and 7C are insertion effectors, the flag for the instructed effect block 7A is changed to "0", and the flags for the blocks 7B and 7C are changed to "1".

Although the embodiment has been described in connection with three effect blocks, any other number of effect blocks may be used.

Further, the no-effect operation has been described above as an operation for setting only the system wet coefficient SW to "0" and leaving the system dry coefficient SD unchanged. However, this just means that it is most preferable to not change the system dry coefficient SD, and the coefficient SD may be changed to any desired value than "0". For instance, a given value corresponding to the system wet coefficient SW may be added to or subtracted from the system dry coefficient SD, or the coefficient SD may be subjected to appropriate arithmetic operations to take on a value other than "0".

Moreover, in the above-described embodiment, the conversion tables are prepared by classifying effects or tone colors common to various type instruments made by a same manufacturer in terms of their individual characteristics. However, if the instruments are made by different manufacturers, there may be provided a conversion table by classifying effects and tone colors peculiar to the individual manufactures, in terms of their characteristics, such that effect data or tone color data can be exchanged therebetween.

Furthermore, although the embodiment has been described in connection with a combination with effect and tone color of which both effect and tone color have been changed, only effect has been changed and only tone color has been changed, an embodiment to change only effect without consideration of tone color is of course included in the scope of the invention.

The present invention, arranged in the manner as has been described so far, tone can be generated in optimum tone color and effect even where there is no specific correspondency in tone color data between different type instruments exchanging tone color data and effect data and where there exists inoperable effect data.

What is claimed is:

1. An electronic musical instrument comprising:

introduction means for introducing, from outside, tone control information containing effect data designating a sound effect;

tone generation means for generating a tone in accordance with the tone control information introduced via said introduction means; and effect data conversion means for, when the effect data contained in said tone control information introduced via said introduction means designates a first sound effect not impartable by said tone generation means, converting said introduced effect data into another data and supplying the converted data to said tone generation means in place of said introduced effect data designating said first sound effect, said effect data conversion means including a table which classifies predetermined sound effects impartable by said tone generation means into plural groups in accordance with individual characteristics of the predetermined sound effects and stores for each of the groups effect data indicative of sound effect belonging to said group, said effect data conversion means, by referring to said table, ascertaining whether or not the effect data introduced via said introduction means designates said first sound effect not impartable by said tone generation means and, if the introduced effect data designates said first sound effect, extracting from said table the effect data indicative of a second sound effect belonging to one of the groups which corresponds to a characteristic of said first sound effect, so as to supply said tone generation means with the extracted effect data indicative of said second sound effect as said converted data.

2. An electronic musical instrument as defined in claim 1 wherein said table stores, for each said group, the effect data indicative of at least one basic sound effect, and said effect data conversion means extracts from said table the effect data indicative of the basic sound effect in one of the groups which corresponds to the characteristic of said first sound effect as the effect data indicative of the second sound effect.

3. An electronic musical instrument as defined in claim 1 wherein if the characteristic of said first sound effect does not correspond to any of said groups, said effect data conversion means supplies said tone generation means with data instructing that no effect should be imparted, in place of said introduced effect data designating the first sound effect.

4. An electronic musical instrument comprising:

introduction means for introducing, from outside, tone control information containing effect data designating a sound effect and tone color data designating a tone color;

tone generation means for generating a tone in accordance with the tone control information introduced via said introduction means;

effect data conversion means for, when the effect data contained in said tone control information introduced via said introduction means designates a sound effect not impartable by said tone generation means, changing said effect data into other data and supplying the other data to said tone generation means;

tone color data conversion means for, when the tone color data contained in said tone control information introduced via said introduction means designates a tone color not generatable by said tone generation means, changing said tone color data into another tone color data designating another tone color and supplying said other tone color data to said tone generation means; and control means for, when there has been a change in at least one of the sound effect and tone color data by at least one of said effect data and tone color data conversion means, determining whether or not a combination of sound effect and tone color based on said change falls under a predetermined inhibition condition and, if the combination of sound effect and tone color based on said change falls under the predetermined inhibition condition, again changing said one of the sound effect and tone color data so that said combination does not fall under the inhibition condition any longer.

5. An electronic musical instrument as defined in claim 4 wherein if no combination of sound effect and tone color based on said change can be found out which does not fall under the predetermined inhibition condition, said control means supplies said tone generation means with data instructing that no effect should be imparted.

6. An electronic musical instrument as defined in claim 4 wherein said control means performs control according to said inhibition condition when said effect data contained in the tone control information is given for achieving an insertion effect.

7. An effect imparting device comprising:

effect impartment means for imparting to a sound signal a sound effect selected from among a plurality of predetermined sound effects;

effect designation means for designating a sound effect, and control means for classifying the sound effect designated by said effect designation means as any of a first class of effect impartable by said effect impartment means, a second class of effect not impartable by said effect impartment means but changeable for another sound effect that is impartable by said effect impartment means and a third class of effect not impartable by said effect impartment means and not changeable for another sound effect that is impartable by said effect impartment means, said control means instructing said effect impartment means to impart the designated sound effect when the designated effect belongs to the first class, instructing said effect impartment means to impart the other sound effect when the designated effect belongs to the second class, and instructing said effect impartment means to impart no sound effect when the designated effect belongs to the third class.

8. An effect imparting device as defined in claim 7 wherein said effect designation means introduces, from outside, effect data designating a sound effect.

9. An effect imparting device as defined in claim 7 wherein said effect impartment means imparts the designated sound effect as an insertion effect, wherein said impartment means controls a level of the sound signal to which the designated sound effect has been imparted in accordance with a variably set wet coefficient, and controls a level of the sound signal to which the designated sound effect has not been imparted in accordance with a variably set dry coefficient, said impartment means adding together the level-controlled sound signals to output a sum of the signals, and wherein when the designated effect belongs to the third class, said control means changes said dry coefficient in said effect impartment means to a predetermined effective value and changes said wet coefficient to zero.

10. An effect imparting device as defined in claim 7 wherein said effect impartment means imparts the designated sound effect as a system effect, wherein said impartment means controls a level of the sound signal to which the designated sound effect has been imparted in accordance with a variably set wet coefficient and controls a level of the sound signal to which the designated sound effect has not been imparted in accordance with a variably set dry coefficient, said effect impartment means adding together the level-controlled sound signals to output a sum of the signals, and wherein when the designated effect belongs to the third class, said control means holds said dry coefficient in said effect impartment means at a currently-set value and changes said wet coefficient to zero.

11. An effect imparting device as defined in claim 7 wherein said effect impartment means controls a level of the sound signal to which the designated sound effect has been imparted in accordance with a variably set wet coefficient and controls a level of the sound signal to which the designated sound effect has not been imparted in accordance with a variably set dry coefficient, wherein said effect impartment means includes flag storage means which stores a flag indicating whether the designated sound effect should be imparted as an insertion effect or as a system effect, and wherein when the designated effect belongs to the third class, said control means, by referring to the flag stored in said flag storage means, performs control to change said dry coefficient to a predetermined effective value and change said wet coefficient to zero if said sound effect is to be imparted as the insertion effect, but hold said dry coefficient at a currently set value and change said wet coefficient to zero if said sound effect is to be imparted as the system effect.

12. An effect imparting device as defined in claim 11 which comprises a plurality of said effect impartment means, and wherein said control means, by referring to said flag storage means for each of the plurality of said effect impartment means, performs said control separately for each said effect impartment means.

13. An effect imparting device comprising:

introduction means for introducing, from outside, effect data designating a desired sound effect to be imparted to a sound signal;

effect impartment means for imparting to said sound signal a sound effect based on the effect data introduced via said introduction means; and effect data conversion means for, when the effect data introduced via said introduction means designates a sound effect not impartable by said effect impartment means, converting said introduced effect data into another effect data designating another sound effect impartable by said effect impartment means and supplying the converted effect data to said effect impartment means, in place of said introduced effect data, so as to cause said effect impartment means to impart to said sound signal the other sound effect designated by said converted effect data.

14. An effect imparting device as defined in claim 13 wherein said effect data conversion means includes a table for inputting therein said effect data introduced via said introduction means and generating output effect data as said converted effect data in response to said input effect data.

15. An effect imparting device as defined in claim 14 wherein said table classifies first predetermined sound effects impartable by said effect impartment means into first plural groups in accordance with individual characteristics of said first predetermined sound effects and also classifies second predetermined sound effects including given sound effects not impartable by said effect impartment means into second plural groups, said second plural groups corresponding in characteristics to said first plural groups, said table generating said output effect data designating a sound effect which belongs to one of said first plural groups corresponding to one of said second plural groups to which a sound effect designated by said input effect data belongs.

16. An effect imparting device as defined in claim 13 which further comprises control means for performing determination as to whether or not a combination of sound effect designated by said converted effect data and tone color of said sound signal to be imparted with said sound effect in said effect impartment means falls under a predetermined inhibition condition and, if the combination of sound effect and tone color falls under the predetermined inhibition condition, performing control to change said one of the sound effect and tone color so that said combination does not fall under the inhibition condition any longer.

17. An effect imparting device as defined in claim 16 which further comprises:

means for introducing, from outside, tone color data designating a tone color;

tone color control means for controlling a tone color of said sound signal on the basis of said tone color data introduced from outside; and tone color data conversion means for, when said tone color data introduced from outside designates a tone color not controllable by said tone color control means, changing said tone color data into another tone color data designating another tone color controllable by said tone color control means, and wherein said control means performs said determination and control on the basis of a combination of sound effect designated by said converted effect data and tone color designated by said other tone color data.

18. An effect imparting device as defined in claim 13, wherein said other sound effect has a characteristic similar to a characteristic of said desired sound effect.

19. A method of generating a tone by use of a tone generation device which generates a tone signal having a given sound effect imparted thereto in accordance with tone control information containing effect data designating the given sound effect, said method comprising the steps of:

introducing, from outside, optional tone control information containing effect data designating an optional sound effect;

when the effect data contained in said tone control information introduced by said step of introducing designates a first sound effect not impartable by said tone generation device, converting said effect data contained in said introduced tone control information into another effect data and supplying said introduced tone control information to said tone generation device, wherein if said effect data is converted by said step of converting, said other effect data is supplied to said tone generation device in place of said effect data contained in said introduced tone control information designating said first sound effect, said step of converting including steps of preparing a table which classifies predetermined sound effects impartable by said tone generation device into plural groups in accordance with individual characteristics of the predetermined sound effects and storing for each of the groups effect data indicative of a sound effect belonging to said group; and ascertaining, by reference to said table, whether or not said effect data contained in said introduced tone control information designates said first sound effect not impartable by said tone generation device and, if said effect data contained in said introduced tone control information designates said first sound effect, extracting from said table the effect data indicative of a second sound effect belonging to one of the groups which corresponds to a characteristic of said first sound effect, so as to supply said tone generation device with the extracted effect data indicative of said second sound effect as said other effect data.

20. A method of generating a tone by use of a tone generation device which generates a tone signal having a given sound effect and given tone color imparted thereto in accordance with tone control information containing effect data designating the given sound effect and tone color data designating the given tone color, said method comprising the steps of:

introducing, from outside, optional tone control information containing effect data designating an optional sound effect;

when the effect data contained in said tone control information introduced by said step of introducing designates a sound effect not impartable by said tone generation device, converting said effect data contained in said introduced tone control information into another effect data and supplying said other effect data to said tone generation device;

when the tone color data contained in said tone control information introduced by said step of introducing designates a tone color not generatable by said tone generation device, converting said tone color data contained in said introduced tone control information into another tone color data designating another tone color and supplying said introduced tone control information to said tone generation device, wherein if said effect data and/or tone color data is converted by said step of converting, said other effect data and/or tone color data is supplied to said tone generation device; and when there has been a conversion of at least one of the sound effect and tone color data by at least one of said steps of converting, determining whether or not a combination of sound effect and tone color based on said conversion falls under a predetermined inhibition condition and, if the combination of sound effect and tone color based on said conversion falls under the predetermined inhibition condition, again converting said one of the sound effect and tone color data so that said combination does not fall under the inhibition condition any longer.

21. A method of imparting an effect by use of an effect imparting device which imparts a sound signal a sound effect selected from among a plurality of predetermined sound effects, said method comprising the steps of:

designating a desired sound effect;

classifying the sound effect designated by said step of designating as any one of a first class of effect impartable by said effect imparting device, a second class of effect not impartable by said effect imparting device but changeable for another sound effect that is impartable by said effect imparting device and a third class of effect not impartable by said effect imparting device and not changeable for another sound effect that is impartable by said effect imparting device; and instructing said effect imparting device to impart the designated sound effect when the designated effect belongs to said first class, instructing said effect imparting device to impart the other sound effect when the designated effect belongs to said second class, and instructing said effect imparting device to impart no sound effect when the designated effect belongs to said third class.

22. A method of imparting an effect to a sound signal by use of an effect imparting device which receives the sound signal and effect data and imparts to the sound signal an effect designated by the effect data, said method comprising the steps of:

introducing, from outside, effect data designating a desired sound effect;

when the effect data introduced by said step of introducing designates a sound effect not impartable by said effect imparting device, converting said introduced effect data into another effect data designating another sound effect impartable by said effect imparting device and supplying said introduced effect data or said other effect data to said effect imparting device, wherein if said effect data is converted by said step of converting, said other effect data is supplied to said effect imparting device in place of said introduced effect data, so as to cause said effect imparting device to impart to said sound signal the other sound effect designated by said other effect data.

23. An effect imparting device comprising:

an interface section adapted to introduce, from outside, effect data designating a desired sound effect to be imparted to a sound signal;

an effector section adapted to impart a sound effect to said sound signal based on the effect data introduced via said interface device; and a control section adapted to, when the effect data introduced via said interface section designates a sound effect not impartable by said effector section, convert said introduced effect data into another effect data designating another sound effect impartable by said effector section and supplying the converted effect data to said effector section, in place of said introduced effect data, so as to cause said effector section to impart to said sound signal the other sound effect designated by said converted effect data.

24. A machine readable recording medium for use in effect imparting processing to impart a sound effect to a sound signal and to perform other processing while sharing a microprocessor, said medium containing program instructions executable by said microprocessor to perform the steps of:

introducing, from outside, effect data designating a desired sound effect to be imparted to said sound signal;

imparting a sound effect to said sound signal based on the effect data introduced in said introducing step; and when the effect data introduced designates a sound effect not impartable in said imparting step, converting said introduced effect data into another effect data designating another sound effect impartable to said sound signal and supplying the converted effect data in place of said introduced effect data, so as to impart to said sound signal the other sound effect designated by said converted effect data.

* * * * *